(12) United States Patent
Cheng et al.

(10) Patent No.: US 12,451,349 B2
(45) Date of Patent: Oct. 21, 2025

(54) SEMICONDUCTOR MANUFACTURING METHOD USING SACRIFICIAL LAYER ETCHING FOR DOPING CONCENTRATION REDUCTION

(71) Applicant: ENKRIS SEMICONDUCTOR, INC., Jiangsu (CN)

(72) Inventors: Kai Cheng, Jiangsu (CN); Peng Xiang, Jiangsu (CN)

(73) Assignee: ENKRIS SEMICONDUCTOR, INC., Jiangsu (CN)

( * ) Notice: Subject to any disclaimer, the term of this patent is extended or adjusted under 35 U.S.C. 154(b) by 537 days.

(21) Appl. No.: 17/916,752

(22) PCT Filed: Aug. 24, 2020

(86) PCT No.: PCT/CN2020/110831
§ 371 (c)(1),
(2) Date: Oct. 3, 2022

(87) PCT Pub. No.: WO2022/040865
PCT Pub. Date: Mar. 3, 2022

(65) Prior Publication Data
US 2023/0154749 A1  May 18, 2023

(51) Int. Cl.
*H01L 21/02* (2006.01)
*H01L 21/3065* (2006.01)
*H10D 62/85* (2025.01)

(52) U.S. Cl.
CPC .. *H01L 21/02581* (2013.01); *H01L 21/02458* (2013.01); *H01L 21/3065* (2013.01); *H01L 21/02505* (2013.01); *H10D 62/8503* (2025.01)

(58) Field of Classification Search
CPC .......... H10D 62/8503; H01L 21/02458; H01L 21/02579; H01L 21/03581; H01L 21/02505
See application file for complete search history.

(56) References Cited

U.S. PATENT DOCUMENTS 9,653,642 B1 * 5/2017 Raring ................. H10D 84/204
2012/0028446 A1 2/2012 Cheng et al.
(Continued)

FOREIGN PATENT DOCUMENTS

CN 104617160 A 5/2015
CN 106024588 A 10/2016
(Continued)

OTHER PUBLICATIONS

ISA State Intellectual Property Office of the People's Republic of China, International Search Report Issued in Application No. PCT/CN2020/110831, May 26, 2021, WIPO, 4 pages.
(Continued)

*Primary Examiner* — Christine S. Kim
*Assistant Examiner* — Emily Farmer
(74) *Attorney, Agent, or Firm* — Small Patent Law Group LLC; Christopher R. Carroll

(57) ABSTRACT

The present application provides a method of manufacturing a semiconductor structure. The manufacturing method includes following steps: at step S1: forming a first epitaxial structure above a substrate, where the first epitaxial structure is doped with a doping element; at step S2: forming a sacrificial layer above the first epitaxial structure; at step S3: etching the sacrificial layer; at step S4: growing an insertion layer above the first epitaxial structure when the etching of the sacrificial layer is completed; and at step S5: growing a second epitaxial structure above the insertion layer; before proceeding to step S4, repeating step S2 and step S3, until a concentration of the doping element in the first epitaxial structure is lower than a predetermined threshold.

19 Claims, 9 Drawing Sheets

(56) References Cited

U.S. PATENT DOCUMENTS

| | | | | |
|---|---|---|---|---|
| 2014/0042391 | A1* | 2/2014 | Kim | H10D 62/8325 |
| | | | | 257/22 |
| 2017/0092738 | A1* | 3/2017 | Chiang | H10D 30/4732 |
| 2017/0170283 | A1* | 6/2017 | Laboutin | H01L 21/0257 |
| 2018/0166565 | A1* | 6/2018 | Chen | H10D 30/015 |
| 2019/0020318 | A1* | 1/2019 | Ishiguro | H01L 21/02505 |
| 2020/0006521 | A1* | 1/2020 | Banerjee | H10D 62/149 |
| 2020/0144371 | A1* | 5/2020 | Tawara | H10D 62/53 |

FOREIGN PATENT DOCUMENTS

| | | | | |
|---|---|---|---|---|
| CN | 106935690 | A | | 7/2017 |
| CN | 107305839 | A * | 10/2017 | ....... H01L 21/02436 |
| CN | 108023001 | A * | 5/2018 | ........... H01L 33/007 |
| CN | 109148368 | A | | 1/2019 |
| CN | 111180340 | A * | 5/2020 | |
| CN | 116235302 | A | | 6/2023 |
| JP | 2004063709 | A | | 2/2004 |

OTHER PUBLICATIONS

ISA State Intellectual Property Office of the People's Republic of China, Written Opinion of the International Searching Authority Issued in Application No. PCT/CN2020/110831, May 26, 2021, WIPO, 5 pages. (Submitted with Machine/ Partial Translation).

TW Patent Office, Office Action Issued in Application No. 110130729, Jun. 28, 2022, 12 pages. (Submitted with Machine/Partial Translation).

State Intellectual Property Office of the People's Republic of China, Office Action and Search Report Issued in Application No. 2020801046913, Mar. 15, 2025, 15 pages. (Submitted with Machine Translation).

* cited by examiner

SEMICONDUCTOR MANUFACTURING METHOD USING SACRIFICIAL LAYER ETCHING FOR DOPING CONCENTRATION REDUCTION

CROSS REFERENCE TO RELATED APPLICATION

This application is a US National Phase of a PCT Application No. PCT/CN2020/110831, filed on Aug. 24, 2020, the contents of which are incorporated herein by reference in its entirety.

TECHNICAL FIELD

This present application relates to the field of semiconductor, and in particular, to a method of manufacturing a semiconductor structure.

BACKGROUND

Generally, in the manufacture of semiconductor devices, when GaN-based power electronics and radio frequency materials are used, it is necessary to introduce doping elements such as iron element and/or magnesium element to increase a resistivity of an epitaxial layer and reduce leakage of the epitaxial layer. However, iron element and/or magnesium element have a memory effect, that is, the doping element iron and/or magnesium in the epitaxial layer will migrate upward into an upper epitaxial structure, so that the upper epitaxial structure that does not need doping also has a large amount of doping element iron and/or magnesium, which will reduce an electron mobility of the upper epitaxial structure, thereby reducing a performance of the device.

Therefore, how to prevent the doping elements in the epitaxial layer from migrating upward into the upper epitaxial structure is a difficult problem to be solved urgently.

SUMMARY

The present application provides a method of manufacturing a semiconductor structure.

A method of manufacturing a semiconductor structure is provided according to embodiments of the present application, and the manufacturing method includes following steps:

S1: forming a first epitaxial structure above a substrate, where the first epitaxial structure is doped with a doping element;

S2: forming a sacrificial layer above the first epitaxial structure;

S3: etching the sacrificial layer;

S4: growing an insertion layer above the first epitaxial structure when the etching of the sacrificial layer is completed; and S5: growing a second epitaxial structure above the insertion layer;

where, before proceeding to step S4, step S2 and step S3 are repeated N times until a concentration of the doping element in the first epitaxial structure is lower than a predetermined threshold.

In some embodiments, the first epitaxial structure is a buffer layer, and the doping element is in the buffer layer; and the second epitaxial structure includes at least a channel layer and a barrier layer that are stacked in sequence.

In some embodiments, the first epitaxial structure includes a buffer layer, a first N-type semiconductor layer, a second N-type semiconductor layer, and a P-type semiconductor layer that are stacked in sequence, and the doping element is in the P-type semiconductor layer; and the second epitaxial structure includes at least a third N-type semiconductor layer.

In some embodiments, the first epitaxial structure includes at least a buffer layer and a first P-type semiconductor layer that are stacked in sequence, and the doping element is in the first P-type semiconductor layer; and the second epitaxial structure includes at least an N-type semiconductor layer and a second P-type semiconductor layer that are stacked in sequence.

In some embodiments, a material of the sacrificial layer includes one or more combinations of InN, InGaN, InAlN, InAlGaN, or GaN.

In some embodiments, a thickness of the sacrificial layer ranges from 1 nm to 1 um.

In some embodiments, a protection layer is provided between the first epitaxial structure and the sacrificial layer.

In some embodiments, if the insertion layer is grown above the first epitaxial structure when the etching of the sacrificial layer is completed, the insertion layer includes one or more combinations of AlN, AlInGaN, or AlGaN;

if the protection layer is provided between the first epitaxial structure and the sacrificial layer, a material of the protection layer includes one or more combinations of AlN, AlInGaN, or AlGaN.

In some embodiments, if the insertion layer is grown above the first epitaxial structure when the etching of the sacrificial layer is completed, an aluminum (Al) composition of the insertion layer has a graded distribution;

if the protection layer is provided between the first epitaxial structure and the sacrificial layer, an aluminum (Al) composition of the protection layer has a graded distribution.

In some embodiments, a thickness of the insertion layer ranges from 0.1 nm to 200 nm.

In some embodiments, the doping element in the first epitaxial structure is iron element or magnesium element; and a concentration of the doping element is constant or varies with a thickness of the first epitaxial structure.

In some embodiments, the sacrificial layer is iron-doped or iron-carbon co-doped.

In some embodiments, the iron doping or iron-carbon co-doping of the sacrificial layer is graded doping.

In some embodiments, step S1, step S2, step S3, step S4 and step S5 are sequentially completed in a same reaction chamber.

In some embodiments, at step S3, a temperature in the reaction chamber is higher than 400 degrees Celsius, and gas is used to etch the sacrificial layer.

In some embodiments, the gas can be one or more combinations of hydrogen gas, ammonia gas, hydrogen chloride gas, or chlorine gas.

In some embodiments, at step S3, the sacrificial layer is completely etched or partially etched.

In some embodiments, a material of the substrate includes one or more combinations of Si, SiC, GaN, AlN, or sapphire.

DETAILED DESCRIPTION OF THE EMBODIMENTS

Figure 1A:
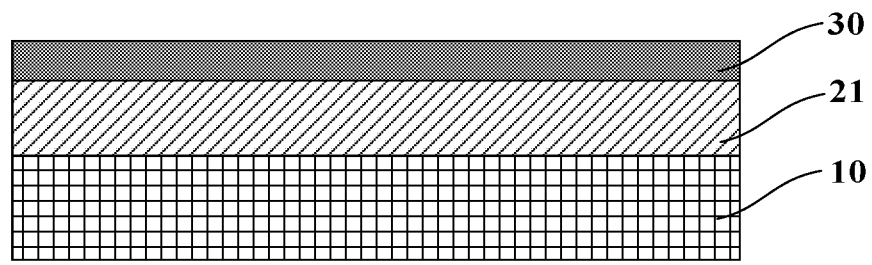
FIG. 1(a)-FIG. 1(f) are process flowcharts of a method of manufacturing a semiconductor structure according to a first embodiment of the present disclosure.

Various embodiments will be described in detail herein, examples of which are illustrated in the accompanying drawings. When the following descriptions involve the drawings, like numerals in different drawings represent like or similar elements unless stated otherwise. The implementations described in the following example embodiments do not represent all implementations consistent with the present application. Rather, they are merely examples of devices and methods consistent with some aspects of the present disclosure as detailed in the appended claims.

The terms used in the present application are for the purpose of describing particular examples only, and are not intended to limit the present disclosure. Unless otherwise defined, the technical or scientific terms used in this application shall have the usual meanings understood by those with ordinary skills in the field to which the present invention belongs. Similar words such as "a" or "an" used in the specification and claims of this application do not mean a quantity limit, but mean that there is at least one. "Include" or "comprise" and other similar words mean that the elements or items before "include" or "comprise" cover the elements or items listed after "include" or "comprise" and their equivalents, and do not exclude other elements or objects. Similar words such as "connect" or "link" are not limited to physical or mechanical connections, and may include electrical connections, whether direct or indirect. "Multiple" includes two and is equivalent to at least two. Terms like "a", "the" and "said" in their singular forms in the specification and the appended claims of the present application are also intended to include plurality, unless clearly indicated otherwise in the context. It is to be understood that the term "and/or" as used herein is and includes any and all possible combinations of one or more of associated listed items.

Embodiment 1

The embodiment provides a method of manufacturing a semiconductor structure, and the method of manufacturing the semiconductor structure includes following steps.

At step 100: a first epitaxial structure is formed above a substrate, and the first epitaxial structure is doped with a doping element.

At step 200: a sacrificial layer is formed above the first epitaxial structure.

At step 300: the sacrificial layer is etched.

At step 400: an insertion layer is grown above the first epitaxial structure when the etching of the sacrificial layer is completed.

At step 500: an epitaxial structure is grown above the insertion layer.

Before proceeding to step 400, step 200 and step 300 are repeated N times until a concentration of the doping element in the first epitaxial structure is lower than a predetermined threshold.

In this way, by forming a sacrificial layer above the first epitaxial structure and etching the sacrificial layer, the concentration of the doping element in the first epitaxial structure is lower than the predetermined threshold, thereby preventing the doping element in the first epitaxial structure from migrating upward into an upper epitaxial structure, ensuring a mobility of electrons in the upper epitaxial structure, so as to improve a performance of the device. That is, by forming the sacrificial layer above the first epitaxial structure, the doping element iron and/or magnesium in the first epitaxial structure will move upward and gather in a surface where the sacrificial layer is in contact with the first epitaxial structure and in the sacrificial layer, then the sacrificial layer is etched, so as to reduce the amount of the doping element iron and/or magnesium migrating upward into the upper epitaxial structure or prevent the doping element iron and/or magnesium from migrating upward into the upper epitaxial structure.

In the method of manufacturing the semiconductor structure according to the embodiment, the first epitaxial structure is a buffer layer, and the doping element is in the buffer layer; the second epitaxial structure includes at least a channel layer and a barrier layer that are stacked in sequence. Each step includes followings.

At step 100: as shown in FIG. 1(a), a buffer layer 21 is formed above the substrate 10, and the buffer layer 21 is doped with a doping element, where the doping element in the buffer layer 21 is iron element or magnesium element. A concentration of the doping element is constant or varies with a thickness of the buffer layer 21 (for example, the first epitaxial structure). The buffer layer 21 is group III nitride epitaxial layer. A material of the substrate 10 includes one or more of Si, SiC, GaN, AlN, or sapphire. In some embodiments, a protection layer 30 is formed above the buffer layer 21, that is, the protection layer 30 is provided between the buffer layer 21 and the sacrificial layer. The protection layer 30 is configured to protect the epitaxial structure under the protection layer, so that the epitaxial structure under the protection layer will not be etched. A material of the protection layer 30 includes one or more of AlN, AlInGaN, or AlGaN. In some embodiments, an aluminum (Al) composition of the protection layer 30 has a graded distribution. A thickness of the protection layer 30 ranges from 0.1 nm to 200 nm. Although the doping element will also gather on the surface of the first epitaxial structure due to surface energy, direct etching of the first epitaxial structure will cause defects in the first epitaxial structure. In addition, the material of the first epitaxial structure is also difficult to etch. Further, in order to reduce a damage to the first epitaxial layer structure during the etching process, the present disclosure also proposes to first grow a protection layer above the first epitaxial layer structure before growing the sacrificial layer.

Figure 1B:
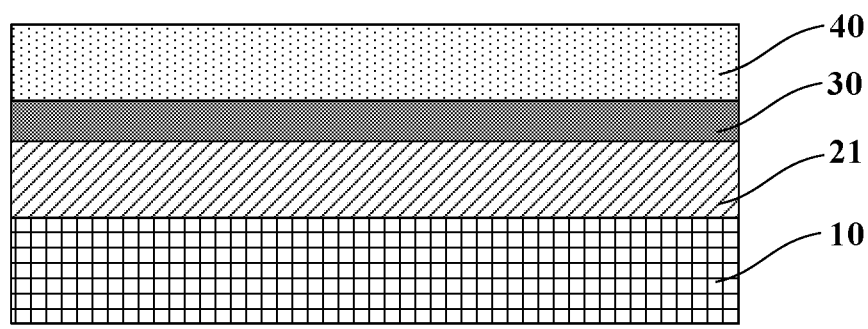

At step 200: as shown in FIG. 1(b), a sacrificial layer 40 is formed above the protection layer 30, so that the doping element iron and/or magnesium in the buffer layer 21 separates out from the buffer layer 21 and gathers in a surface where the sacrificial layer 40 is in contact with the protection layer 30 and in the sacrificial layer 40. The protection layer 30 does not prevent the doping element iron and/or magnesium in the buffer layer 21 from separating out from the buffer layer 21 and migrating to the upper epitaxial structure. A material of the sacrificial layer 40 includes one or more of InN, InGaN, InAlN, InAlGaN, or GaN. In some embodiments, the sacrificial layer 40 is iron-doped or iron-carbon co-doped. Furthermore, the iron doping or iron-carbon co-doping of the sacrificial layer is graded doping. In some embodiments, a thickness of the sacrificial layer 40 ranges from 1 nm to 1 um.

In the embodiment that does not include the protection layer, the sacrificial layer 40 is formed directly above the buffer layer 21, so that the doping element iron and/or magnesium in the buffer layer 21 separates out from the buffer layer 21 and gathers in a surface where the sacrificial layer 40 is in contact with the buffer layer 21 and in the sacrificial layer 40.

Figure 1C:
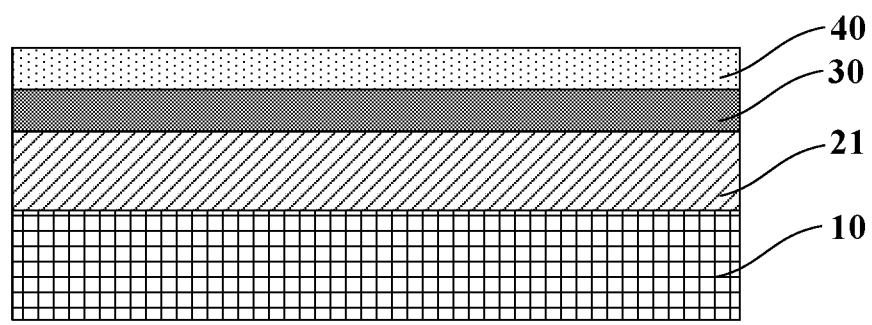

At step 300: as shown in FIG. 1(c), the sacrificial layer 40 is etched, so that the doping element iron and/or magnesium migrated into the sacrificial layer 40 are removed together, so as to reduce the amount of the doping element iron and/or magnesium migrating upward into the upper epitaxial structure or prevent the doping element iron and/or magnesium from migrating upward into the upper epitaxial structure. In some embodiments, a temperature in a reaction chamber is higher than 400 degrees Celsius, so that the sacrificial layer can be directly etched in the reaction chamber without using other tools or etching methods. The sacrificial layer 40 is etched with an etching gas, and the etching gas can include hydrogen gas, ammonia gas, hydrogen chloride gas, and/or chlorine gas.

Figure 1D:
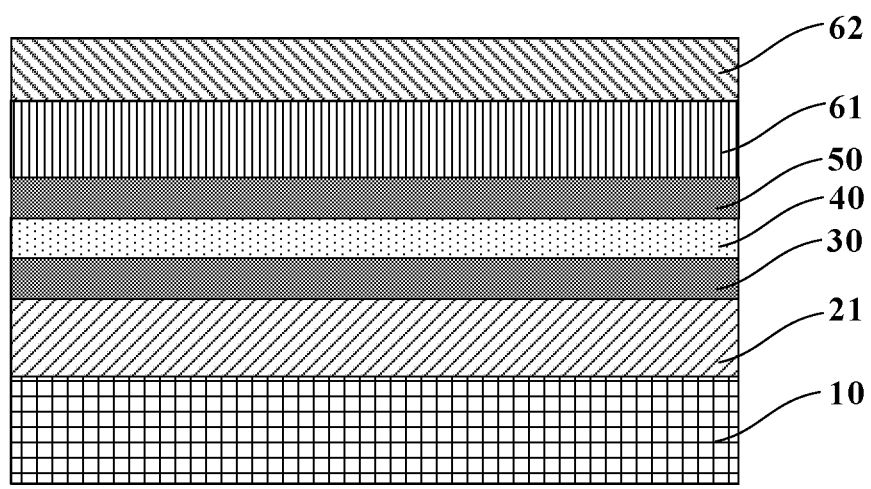

At step 400: as shown in FIG. 1(d), an insertion layer 50 is grown above the protection layer 30 when the etching of the sacrificial layer 40 is completed. A material of the insertion layer 50 includes one or more combinations of AlN, AlInGaN, or AlGaN. The insertion layer can flatten an etched semi-finished structure to a certain extent, thereby reducing a density of dislocations in the second epitaxial structure, increasing a reliability of the semiconductor structure. In some embodiments, an aluminum (Al) composition of the insertion layer 50 has a graded distribution. A thickness of the insertion layer 50 ranges from 0.1 nm to 200 nm.

In some embodiments that do not include the protection layer, the insertion layer 50 is grown above the buffer layer 21 when the etching of the sacrificial layer 40 is completed.

At step 500: a channel layer 61 and a barrier layer 62 are formed above the insertion layer 50.

Figure 1E:
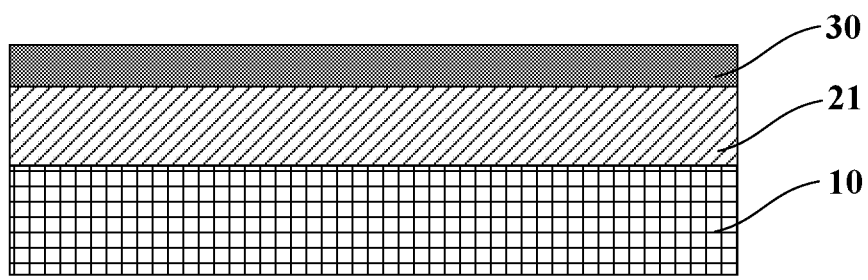

At step 300, there are two situations when etching the sacrificial layer 40 is completed. The first situation includes that: as shown in FIG. 1(c), there is a part of the sacrificial layer 40 remained on the protection layer 30. The second situation includes that: as shown in FIG. 1(e), the sacrificial layer 40 is completely etched away.

Figure 1F:
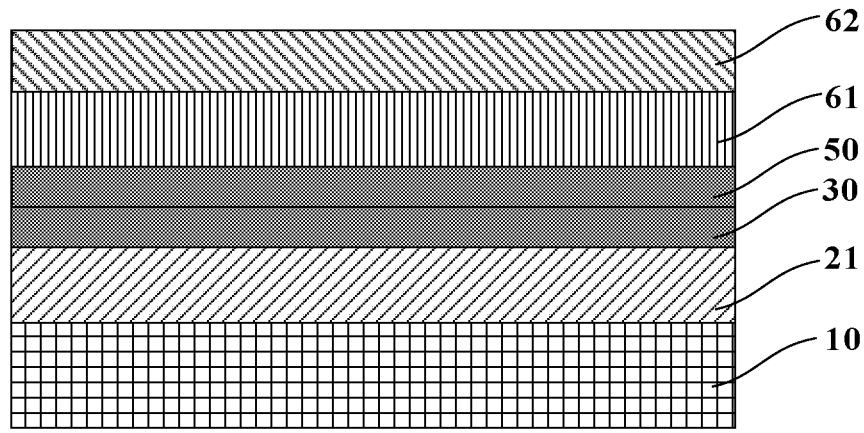

Correspondingly, in the first situation, at step 400, as shown in FIG. 1(d), the semiconductor structure 1 is formed by forming the insertion layer 50 above the remained sacrificial layer 40, and then forming the channel layer 61 and the barrier layer 62; in the second situation, as shown in FIG. 1(f), the semiconductor structure 1 is formed by directly forming the insertion layer 50 above the protection layer 30, and then forming the channel layer 61 and the barrier layer 62.

Before proceeding to step 400, above the buffer layer 21, step 200 and step 300 are repeated for N times until the concentration of the doping element in the buffer layer 21 is lower than a predetermined threshold. The predetermined threshold is defined according to requirements for parameters of different device, and then a number N of times that steps 200 and 300 need to be repeated is determined according to the predetermined threshold. In some embodiments, the number N of repeating step 200 and step 300 is less than or equal to 100,000.

Step 100, step 200, step 300, step 400 and step 500 are completed in sequence in the same reaction chamber, and there is no need to move epitaxial materials out of the reaction chamber during intermediate processes, on the one hand, a production efficiency and a yield of finished products are improved; on the other hand, a risk of contaminating surfaces by external impurities due to the epitaxial material moving out from the reaction chamber is avoided.

In this way, by forming the sacrificial layer above the protection layer on the buffer layer or forming directly above the buffer layer and etching the sacrificial layer, the concentration of doping element in the buffer layer is lower than a predetermined threshold, thereby preventing the doping element in the buffer layer from migrating upward into an upper epitaxial structure, ensuring a mobility of electrons in the channel layer and improving a performance of the device.

In some embodiments, by forming the sacrificial layer above the protection layer on the buffer layer, the doping element iron and/or magnesium can gather in a surface where the sacrificial layer is in contact with the protection layer and in the sacrificial layer, then the sacrificial layer is etched, so as to reduce the amount of the doping element iron and/or magnesium migrating upward into the upper epitaxial structure or prevent the doping element iron and/or magnesium from migrating upward into the upper epitaxial structure.

Alternatively, by directly forming the sacrificial layer above the buffer layer, the doping element iron and/or magnesium can gather in the surface where the sacrificial layer is in contact with the buffer layer and in the sacrificial layer, and then the sacrificial layer is etched, so as to reduce the amount of the doping element iron and/or magnesium migrating upward into the upper epitaxial structure or prevent the doping element iron and/or magnesium from migrating upward into the upper epitaxial structure.

Embodiment 2

Manufacturing steps of the method of manufacturing a semiconductor structure in the embodiment are substantially the same as those in Embodiment 1, except that the first epitaxial structure includes a buffer layer, a first N-type semiconductor layer, a second N-type semiconductor layer and a P-type semiconductor layer that are stacked in sequence, the doping element is in the P-type semiconductor layer; the second epitaxial structure includes at least a third N-type semiconductor layer.

At step 100, the method includes: sequentially forming the buffer layer, the first N-type semiconductor layer, the second N-type semiconductor layer, and the P-type semiconductor layer above the substrate, where the doping element is in the P-type semiconductor layer.

At step 500, the method includes: forming the third N-type semiconductor layer above the insertion layer.

The steps are as follows.

Figure 2A:
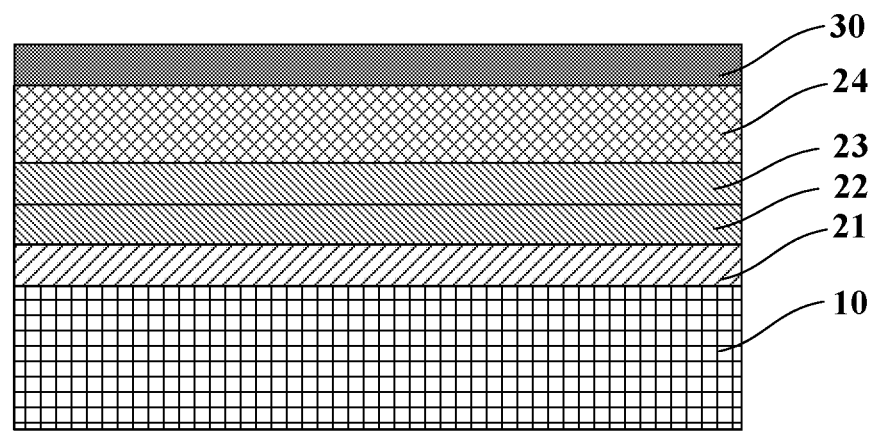
FIG. 2(a)-FIG. 2(f) are process flowcharts of a method of manufacturing a semiconductor structure according to a second embodiment of the present disclosure.

At step 100: as shown in FIG. 2(a), the buffer layer 21, the first N-type semiconductor layer 22, the second N-type semiconductor layer 23, and the P-type semiconductor layer 24 are sequentially formed above the substrate 10, and the P-type semiconductor layer 24 is doped with a doping element, where the doping element in the P-type semiconductor layer 24 is iron element or magnesium element. A concentration of the doping element is constant or varies with a thickness of the P-type semiconductor layer 24 (for example, a doped layer structure in the first epitaxial structure). In some embodiments, a protection layer 30 is formed above the P-type semiconductor layer 24, that is, the protection layer 30 is provided between the P-type semiconductor layer 24 and the sacrificial layer. Relevant content of the protection layer 30 is not repeated here, the content in Embodiment 1 can be referred to.

Figure 2B:
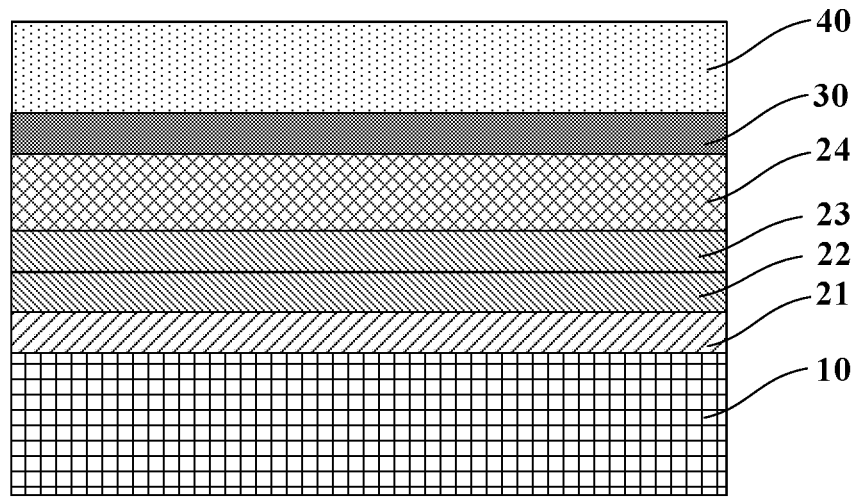

At step 200: as shown in FIG. 2(b), a sacrificial layer 40 is formed above the protection layer 30, so that the doping element iron and/or magnesium in the P-type semiconductor layer 24 migrates upward and gathers in a surface where the sacrificial layer 40 is in contact with the protection layer 30 and in the sacrificial layer 40.

In the embodiment that does not include the protection layer, the sacrificial layer 40 is formed directly above the P-type semiconductor layer 24, so that the doping element iron and/or magnesium in the P-type semiconductor layer 24 migrates upward and gathers in the surface where the sacrificial layer 40 is in contact with the P-type semiconductor layer 24 and in the sacrificial layer 40.

Figure 2C:
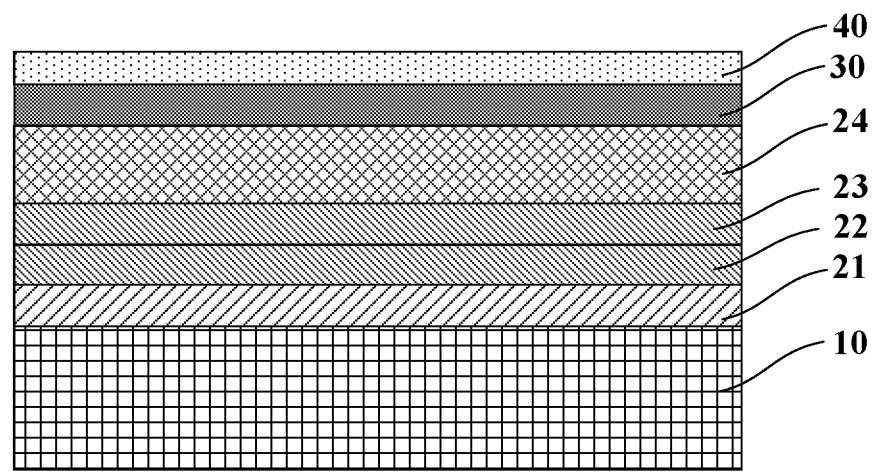

At step 300: as shown in FIG. 2(c), the sacrificial layer 40 is etched, so that the doping element iron and/or magnesium migrated into the sacrificial layer 40 are removed together, so as to reduce the amount of the doping element iron and/or magnesium migrating upward into the upper epitaxial structure or prevent the doping element iron and/or magnesium from migrating upward into the upper epitaxial structure. Related content of process conditions for etching the sacrificial layer 40 is not repeated here, the content in Embodiment 1 can be referred to.

Figure 2D:
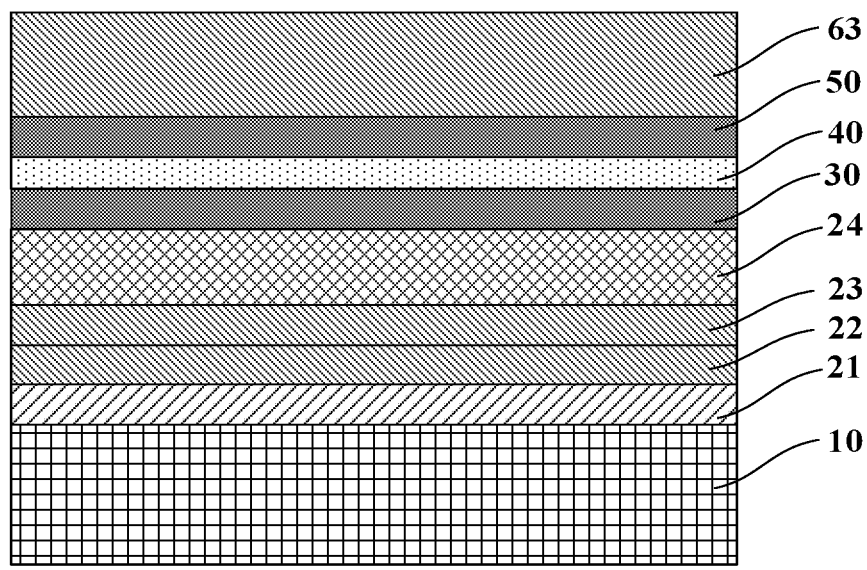

At step 400: as shown in FIG. 2(d), an insertion layer 50 is grown above the protective layer 30 when the etching of the sacrificial layer 40 is completed. The insertion layer 50 is not described here, the content in Embodiment 1 can be referred to.

In the embodiment that does not include the protection layer, the insertion layer 50 is grown above the P-type semiconductor layer 24 when the etching of the sacrificial layer 40 is completed.

At step 500, the third N-type semiconductor layer is formed above the insertion layer 50.

The first N-type semiconductor layer 22 can be an N-type heavily doped GaN layer; the second N-type semiconductor layer 23 can be an N-type lightly doped GaN layer; the P-type semiconductor layer 24 can be a P-type GaN layer; the third N-type semiconductor layer 63 can be an N-type heavily doped GaN layer.

Figure 2E:
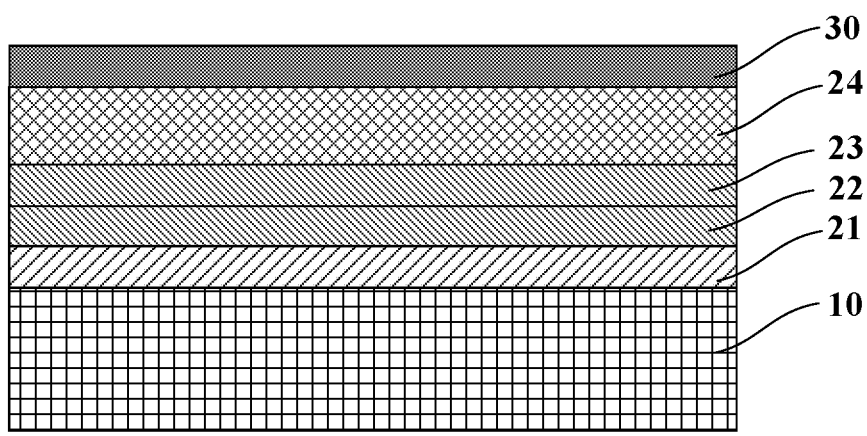

Same as Embodiment 1, at step 300, there are two situations when etching the sacrificial layer 40 is completed. The first situation includes that: as shown in FIG. 2(c), there is a part of the sacrificial layer 40 remained on the protection layer 30; The second situation includes that: as shown in FIG. 2(e), the sacrificial layer 40 is completely etched away.

Figure 2F:
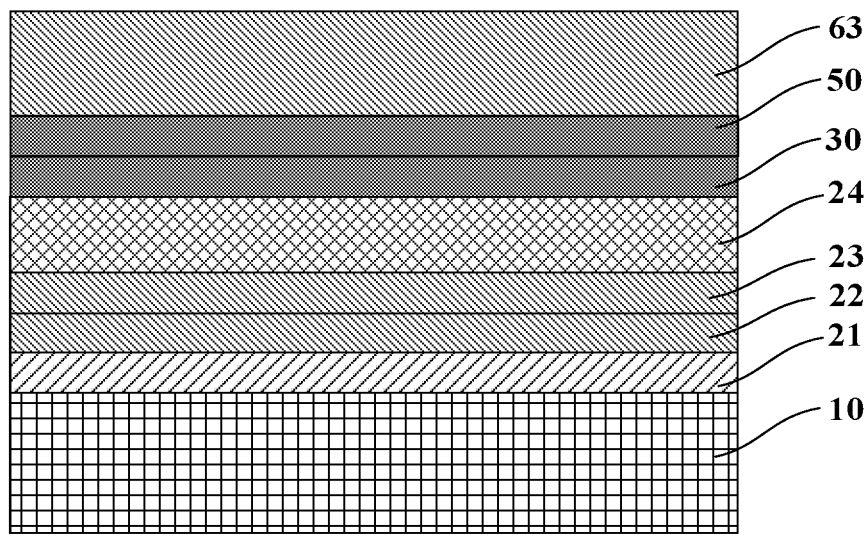

Correspondingly, in the first situation, at step 400, as shown in FIG. 2(d), the semiconductor structure 2 is formed by forming an insertion layer 50 above the remained sacrificial layer 40, and then forming the third N-type semiconductor structure 63. In the second situation, as shown in FIG. 2(f), the semiconductor structure 2 is formed by directly forming the insertion layer 50 above the protection layer 30, and then forming the third N-type semiconductor layer 63.

Before proceeding to step 400, step 200 and step 300 are repeated N times until a concentration of the doping element in the P-type semiconductor layer 24 is lower than a predetermined threshold. Related content of the predetermined threshold and the number N of repeating step 200 and step 300 are not repeated here, the content of Embodiment 1 can be referred to.

In this way, one or more sacrificial layers are formed above the protection layer on the P-type semiconductor layer or formed directly above the P-type semiconductor layer, and then are etched, so that the concentration of the doping element in the P-type semiconductor layer is lower than the predetermined threshold, thereby preventing the doping element in the P-type semiconductor layer from migrating upward into an upper epitaxial structure, ensuring a mobility of electrons in the channel layer, and improving a performance of a device.

Embodiment 3

Manufacturing steps and the method of manufacturing a semiconductor structure in this embodiment are substantially the same as those in Embodiment 1, except that the first epitaxial structure includes at least a buffer layer and a first P-type semiconductor layer that are stacked in sequence. The doping element is in the first P-type semiconductor layer; the second epitaxial structure includes at least an N-type semiconductor layer and a second P-type semiconductor layer that are stacked in sequence.

At step 100, the method includes: sequentially forming the buffer layer and the first P-type semiconductor layer above the substrate, where the doping element is in the first P-type semiconductor layer.

At step 500, the method includes: sequentially forming the N-type semiconductor layer and the second P-type semiconductor layer above the insertion layer.

The steps are as follows.

Figure 3A:
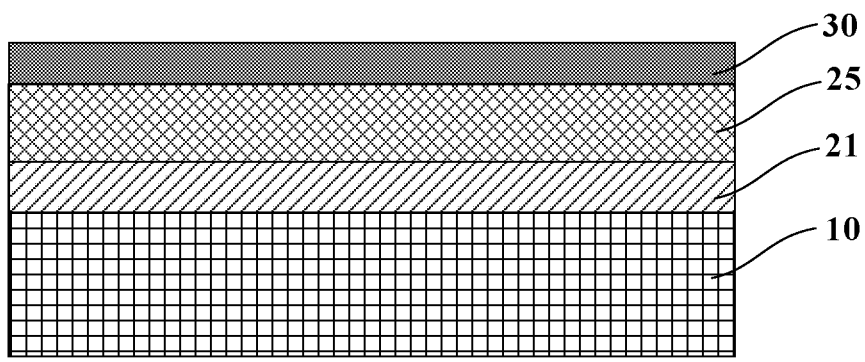
FIG. 3(a)-FIG. 3(f) are process flowcharts of a method of manufacturing a semiconductor structure according to a third embodiment of the present disclosure.

At step 100: as shown in FIG. 3(a), the buffer layer 21 and the first P-type semiconductor layer 25 are sequentially formed above the substrate 10. The first P-type semiconductor layer 25 is doped with a doping element. The doping element in the first P-type semiconductor layer 25 is iron element or magnesium element. A concentration of the doping element is constant or varies with a thickness of the first P-type semiconductor layer 25 (for example, a doped layer structure in the first epitaxial structure). In some embodiments, a protection layer 30 is formed above the first P-type semiconductor layer 25, that is, the protection layer 30 is provided between the first P-type semiconductor layer 25 and the sacrificial layer. Relevant content of the protection layer 30 is not repeated here, the content in Embodiment 1 can be referred to.

Figure 3B:
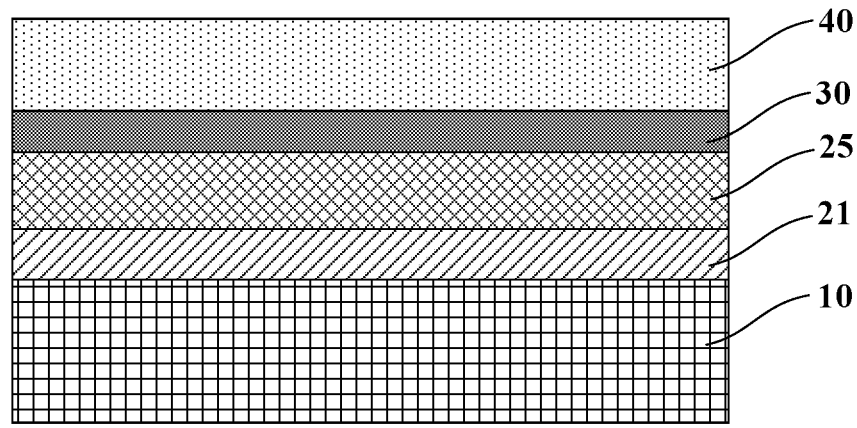

At step 200: as shown in FIG. 3(b), a sacrificial layer 40 is formed above the protection layer 30, so that the doping element iron and/or magnesium in the first P-type semiconductor layer 25 separates out from the first P-type semiconductor layer 2 and gathers in a surface where the sacrificial layer 40 is in contact with the protection layer 30 and in the sacrificial layer 40.

In some embodiments that do not include the protection layer, the sacrificial layer 40 is formed directly above the first P-type semiconductor layer 25, so that the doping element iron and/or magnesium in the first P-type semiconductor layer 25 separates out from the first P-type semiconductor layer 2 and gathers in the surface where the sacrificial layer 40 is in contact with the first P-type semiconductor layer 25 and in the sacrificial layer 40.

Figure 3C:
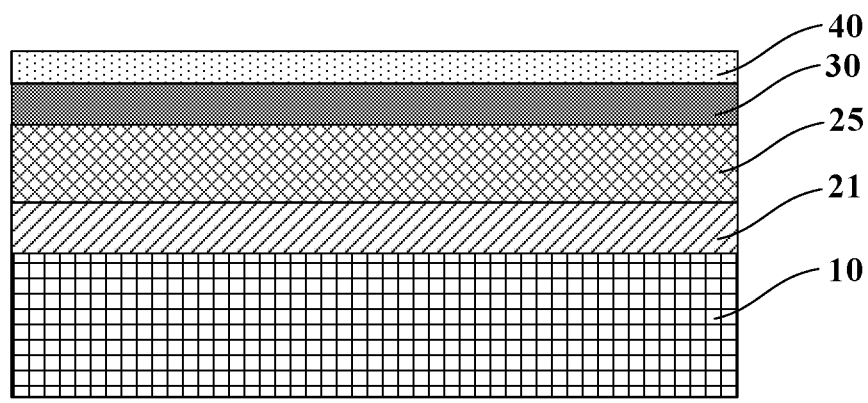

At step 300: as shown in FIG. 3(c), the sacrificial layer 40 is etched, so that the doping element iron and/or magnesium migrated into the sacrificial layer 40 are removed together, so as to reduce the amount of the doping element iron and/or magnesium migrating upward into the upper epitaxial structure or prevent the doping element iron and/or magnesium from migrating upward into the upper epitaxial structure. Related content of process conditions for etching the sacrificial layer 40 is not repeated here, the content in Embodiment 1 can be referred to.

Figure 3D:
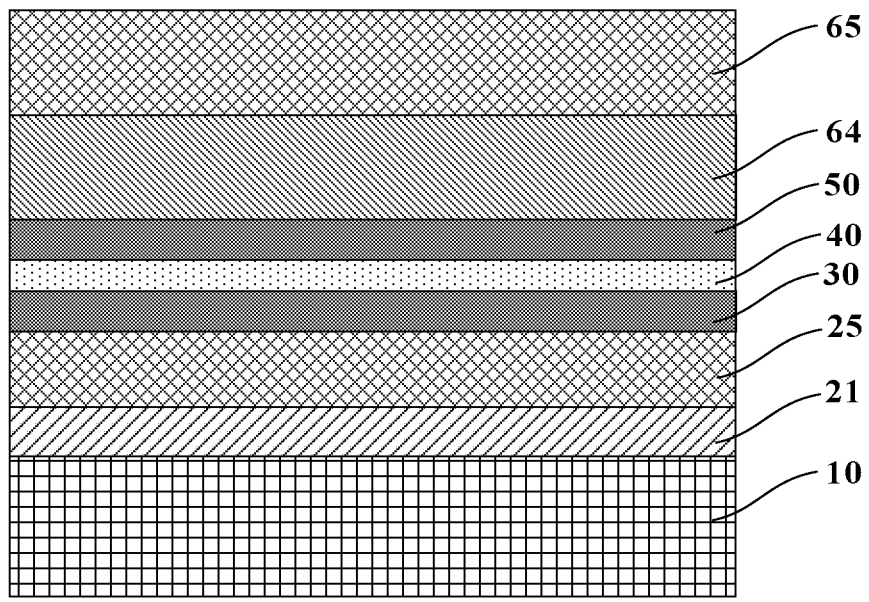

At step 400: as shown in FIG. 3(d), an insertion layer 50 is grown above the protection layer 30 when the etching of the sacrificial layer 40 is completed. The insertion layer 50 is not described here, the content in Embodiment 1 can be referred to.

In some embodiments do not include the protection layer, the insertion layer 50 is grown above the first P-type semiconductor layer 25 when the etching of the sacrificial layer 40 is completed.

At step 500: the N-type semiconductor layer 64 and the second P-type semiconductor layer 65 are sequentially formed above the insertion layer 50.

The first P-type semiconductor layer 25 can be a P-type GaN layer; the N-type semiconductor layer 64 can be an N-type GaN layer; and the second P-type semiconductor layer 65 can be a P-type GaN layer.

Figure 3E:
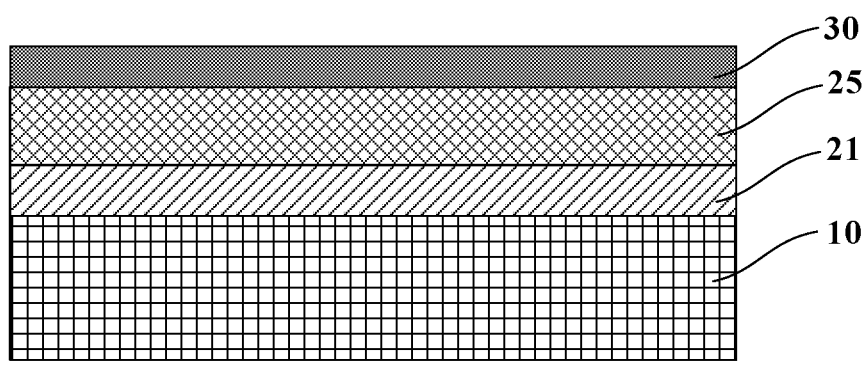

Same as Embodiment 1, at step 300, there are two situations when etching the sacrificial layer 40 is completed. The first situation includes that: as shown in FIG. 3(c), there is a part of the sacrificial layer 40 remained on the protection layer 30. The second situation includes that: as shown in FIG. 3(e), the sacrificial layer 40 is completely etched away.

Figure 3F:
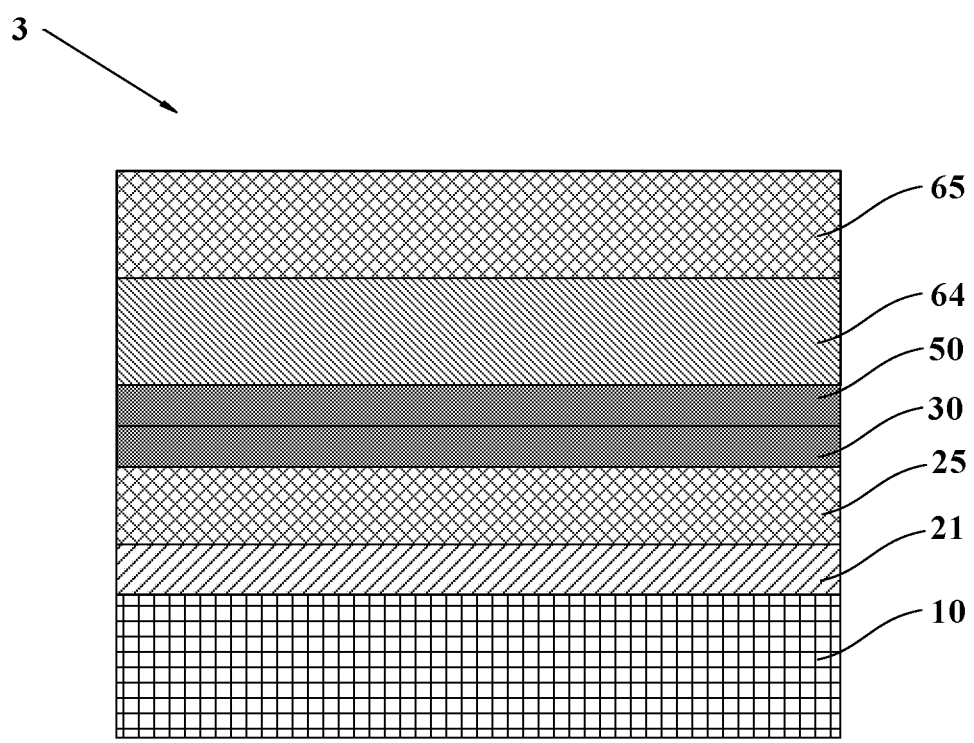

Correspondingly, in the first situation, at step 400, as shown in FIG. 3(d), the semiconductor structure 3 is formed by forming an insertion layer 50 above the remained sacrificial layer 40, and then forming the third N-type semiconductor structure 64. In the second situation, as shown in FIG. 3(f), the semiconductor structure 3 is formed by directly forming the third N-type semiconductor layer 64 above the protection layer 30.

Before proceeding to step 400, step 200 and step 300 are repeated N times until a concentration of the doping element in the P-type semiconductor layer 25 is lower than a predetermined threshold. Related content of the predetermined threshold and a number N of repeating step 200 and step 300 is not repeated here, the content of Embodiment 1 can be referred to.

In this way, one or more sacrificial layers are formed above the protection layer on the first P-type semiconductor layer or formed directly above the first P-type semiconductor layer, and then are etched, so that the concentration of the doping element in the first P-type semiconductor layer is lower than the predetermined threshold, thereby preventing the doping element in the P-type semiconductor layer from migrating upward into the upper epitaxial structure, ensuring a mobility of electrons in the channel layer, and improving a performance of a device.

The above-mentioned embodiments are embodiments of the present disclosure, and does not limit the present disclosure. Any modification, equivalent replacement, improvement, etc., made within the spirit and principles of the present disclosure shall be included in the protection scope of the present disclosure.

The invention claimed is:

1. A method of manufacturing a semiconductor structure, comprising:
    S1: forming a first epitaxial structure above a substrate, wherein the first epitaxial structure is doped with a doping element;
    S2: forming a sacrificial layer above the first epitaxial structure;
    S3: etching the sacrificial layer;
    S4: growing an insertion layer above the first epitaxial structure when the etching of the sacrificial layer is completed;
    S5: growing the second epitaxial structure above the insertion layer;
    wherein, before proceeding to step S4, step S2 and step S3 are repeated N times until a concentration of the doping element in the first epitaxial structure is lower than a predetermined threshold; and
    wherein a protection layer is provided between the first epitaxial structure and the sacrificial layer.

2. The method according to claim 1, wherein the first epitaxial structure is a buffer layer, the doping element is in the buffer layer; and the second epitaxial structure comprises a channel layer and a barrier layer that are stacked in sequence.

3. The method according to claim 1, wherein the first epitaxial structure comprises a buffer layer, a first N-type semiconductor layer, a second N-type semiconductor layer and a P-type semiconductor layer that are stacked in sequence, the doping element is in the P-type semiconductor layer; and the second epitaxial structure comprises a third N-type semiconductor layer.

4. The method of according to claim 1, wherein the first epitaxial structure comprises a buffer layer and a first P-type semiconductor layer that are stacked in sequence, the doping element is in the first P-type semiconductor layer; and the second epitaxial structure comprises an N-type semiconductor layer and a second P-type semiconductor layer that are stacked in sequence.

5. The method according to claim 1, wherein a material of the sacrificial layer comprises one or more combinations of InN, InGaN, InAlN, InAlGaN, or GaN.

6. The method according to claim 1, wherein a thickness of the sacrificial layer ranges from 1 nm to 1 um.

7. The method according to claim 1, wherein the insertion layer comprises one or more of AlN, AlInGaN, or AlGaN.

8. The method according to claim 1, wherein an aluminum composition of the insertion layer has a graded distribution.

9. The method according to claim 1, wherein a thickness of the insertion layer ranges from 0.1 nm to 200 nm.

10. The method according to claim 1, wherein the doping element in the first epitaxial structure is iron element or magnesium element; and a concentration of the doping element is constant or varies with a thickness of the first epitaxial structure.

11. The method according to claim 1, wherein the sacrificial layer is iron-doped or iron-carbon co-doped.

12. The method according to claim 11, wherein the iron doping or iron-carbon co-doping of the sacrificial layer is graded doping.

13. The method according to claim 1, wherein step S1, step S2, step S3, step S4 and S5 are sequentially completed in a same reaction chamber.

14. The method according to claim 1, wherein, at step S3, a temperature in the reaction chamber is higher than 400 degrees Celsius, and the sacrificial layer is etched with gas.

15. The method according to claim 14, wherein the gas comprises one or more of hydrogen gas, ammonia gas, hydrogen chloride gas, or chlorine gas.

16. The method according to claim 1, wherein, at step S3, the sacrificial layer is completely etched or partially etched.

17. The method according to claim 1, wherein a material of the substrate includes one or more of Si, SiC, GaN, AlN, or sapphire.

18. The method according to claim 1, further comprising, before forming the sacrificial layer above the first epitaxial structure, forming a protection layer above the first epitaxial structure, and forming the sacrificial layer above the protection layer, wherein a material of the protection layer comprises one or more of AlN, AlInGaN, or AlGaN.

19. The method according to claim 1, further comprising, before forming the sacrificial layer above the first epitaxial structure, forming a protection layer above the first epitaxial structure, and forming the sacrificial layer above the protection layer, wherein an aluminum composition of the protection layer has a graded distribution.

\* \* \* \* \*